(12) United States Patent
Xue

(10) Patent No.: US 8,550,575 B2
(45) Date of Patent: Oct. 8, 2013

(54) ELECTRONIC DEVICE ENCLOSURE

(75) Inventor: Yuan Xue, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 347 days.

(21) Appl. No.: 12/870,638

(22) Filed: Aug. 27, 2010

(65) Prior Publication Data

US 2011/0279005 A1 Nov. 17, 2011

(30) Foreign Application Priority Data

May 11, 2010 (CN) .......................... 2010 1 0168850

(51) Int. Cl.
*A47B 81/00* (2006.01)

(52) U.S. Cl.
USPC ....................................... 312/223.2; 312/236

(58) Field of Classification Search
USPC .......... 312/236, 223.2, 329–329; 361/679.46, 361/679.48, 679.49, 679.51, 692, 694–695
See application file for complete search history.

(56) References Cited

U.S. PATENT DOCUMENTS

| | | | |
|---|---|---|---|
| 4,442,890 A * | 4/1984 | Vandervaart | 165/124 |
| 4,500,944 A * | 2/1985 | Roberts et al. | 361/697 |
| 5,119,270 A * | 6/1992 | Bolton et al. | 361/679.33 |
| 5,191,544 A * | 3/1993 | Benck et al. | 361/688 |
| 5,733,191 A * | 3/1998 | Lam et al. | 454/290 |
| 5,969,942 A * | 10/1999 | Heckner et al. | 361/695 |
| 6,279,339 B1 * | 8/2001 | Correa et al. | 62/262 |
| 6,678,157 B1 * | 1/2004 | Bestwick | 361/695 |
| 6,710,240 B1 * | 3/2004 | Chen et al. | 361/695 |
| 6,822,863 B1 * | 11/2004 | Artman et al. | 361/695 |
| 7,403,387 B2 * | 7/2008 | Pav et al. | 361/694 |
| 7,535,709 B2 * | 5/2009 | Fan et al. | 361/695 |
| 8,141,963 B2 * | 3/2012 | Chen et al. | 312/223.2 |
| 8,144,457 B2 * | 3/2012 | Mertesdorf et al. | 361/679.4 |
| 8,243,434 B2 * | 8/2012 | Xue | 361/679.33 |
| 2004/0201333 A1 * | 10/2004 | Chen | 312/223.2 |
| 2005/0029908 A1 * | 2/2005 | Fang | 312/223.2 |
| 2005/0063156 A1 * | 3/2005 | Olesiewicz et al. | 361/695 |
| 2006/0075509 A1 * | 4/2006 | Kishon | 726/34 |
| 2008/0117590 A1 * | 5/2008 | Dey et al. | 361/687 |
| 2009/0178991 A1 * | 7/2009 | Rasmussen et al. | 211/183 |

* cited by examiner

*Primary Examiner* — Hanh V Tran
(74) *Attorney, Agent, or Firm* — Altis & Wispro Law Group, Inc.

(57) ABSTRACT

An electronic device enclosure includes an enclosure, a bracket fixed to the enclosure and an air deflecting plate fixed to the bracket. The bracket has an opening large enough to allow storage devices to pass therethrough. The air deflecting plate includes two pivot members defined on an air deflecting plate top edge and two securing members defined on an air deflecting plate bottom edge. The pivot members are fixed to a top of the bracket. The securing members are elastically fixed to a bottom of the bracket. The air deflecting plate is fixed to the bracket to cover the opening, which deflects air from outside of the bracket and facilitates heat dissipation.

12 Claims, 9 Drawing Sheets

;# ELECTRONIC DEVICE ENCLOSURE

BACKGROUND

1. Technical Field

The disclosure generally relates to electronic device enclosures, especially to an electronic device enclosure with air deflecting plate.

2. Description of Related Art

In some computers and servers, a fan module is placed on the central processing unit (CPU) to remove heat generated by the CPU and other electronic components, and another fan module is secured to a rear plate or a front plate of a computer or server chassis and aligned with the CPU. However, because the another fan module described above is aligned with the CPU, heat generated by a disk drive module, placed on the front panel of the computer far away from the CPU, may not be dissipated efficiently.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
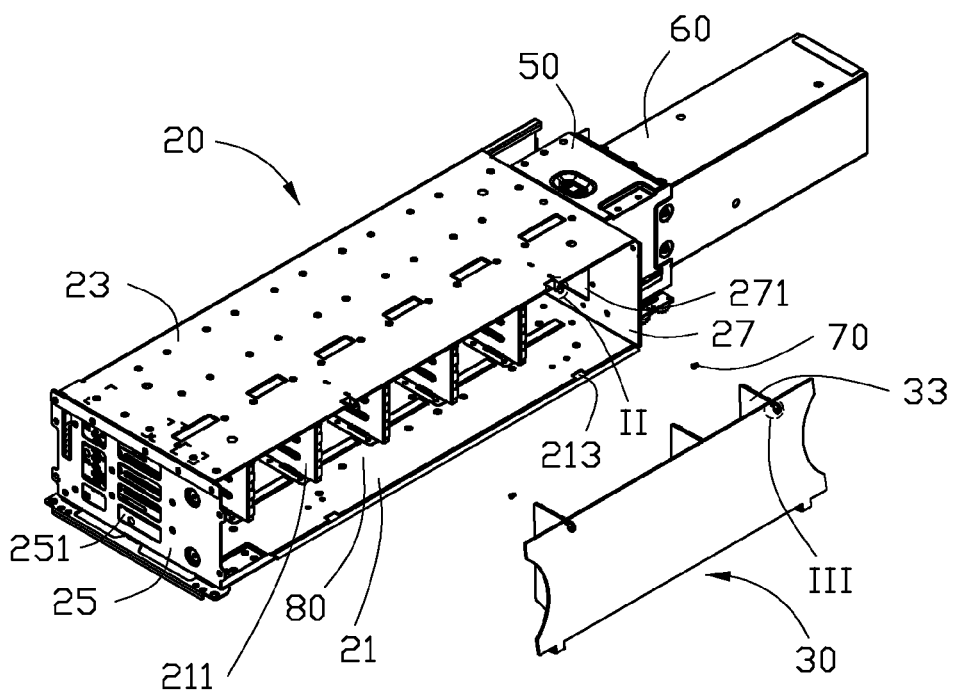
FIG. 1 is an exploded, isometric view of an embodiment of an electronic device enclosure; the electronic device enclosure includes an enclosure, a bracket, an air deflecting plate, and air guiding bracket and a fan receiving bracket.
Figure 1:
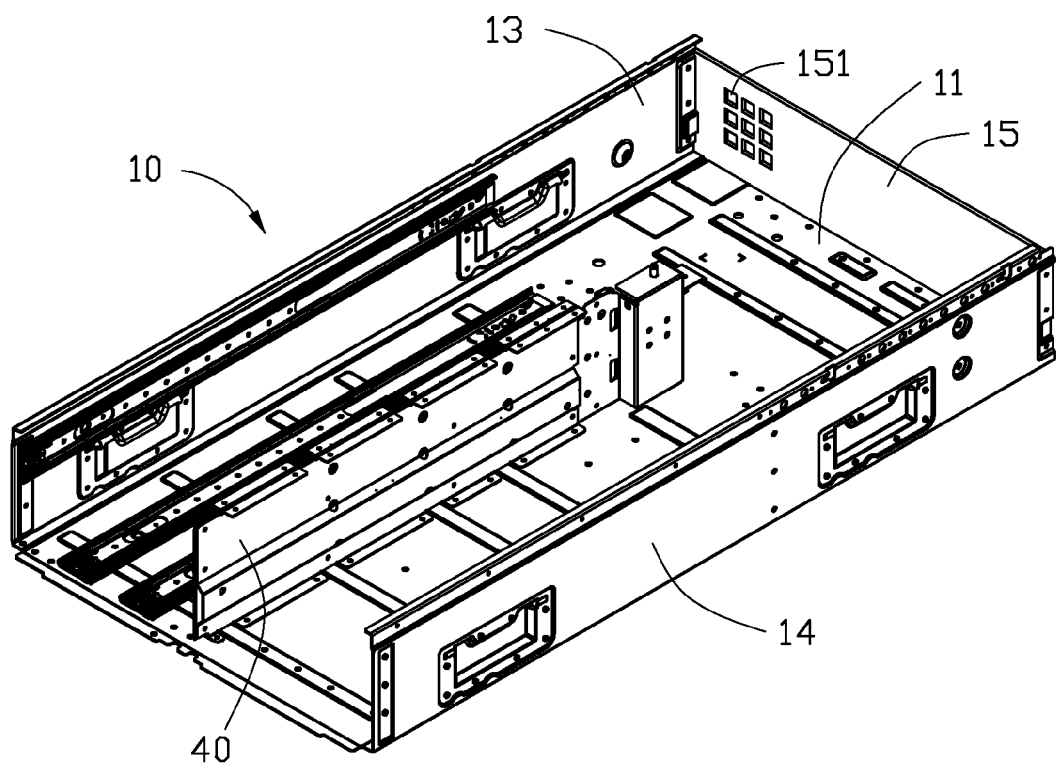
Figure 2:
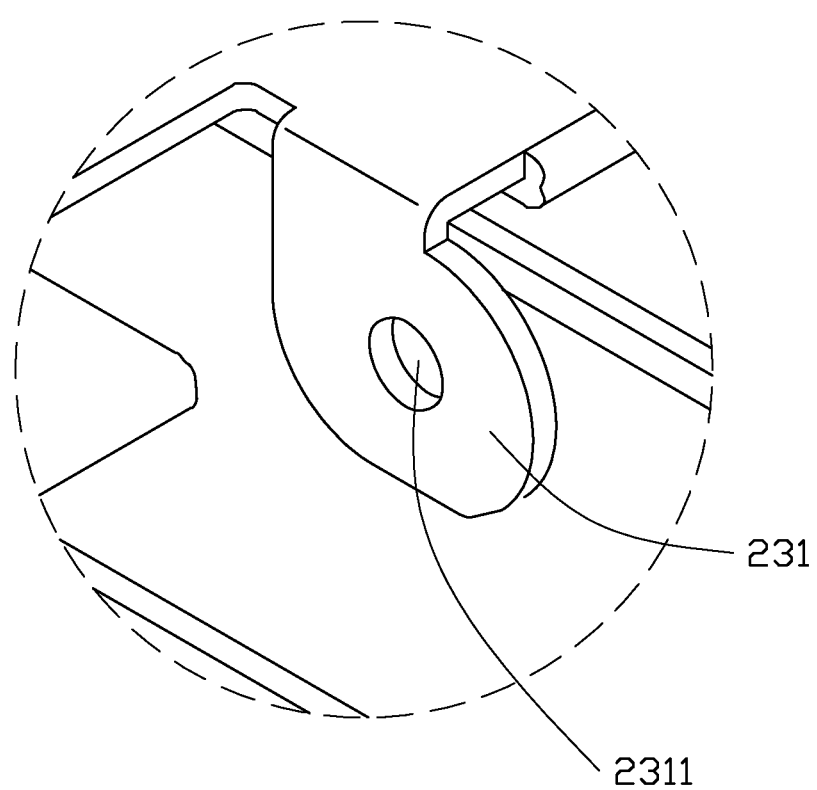
FIG. 2 is a partial enlarged, isometric view of the electronic device enclosure of FIG. 1, showing section II.
Figure 3:
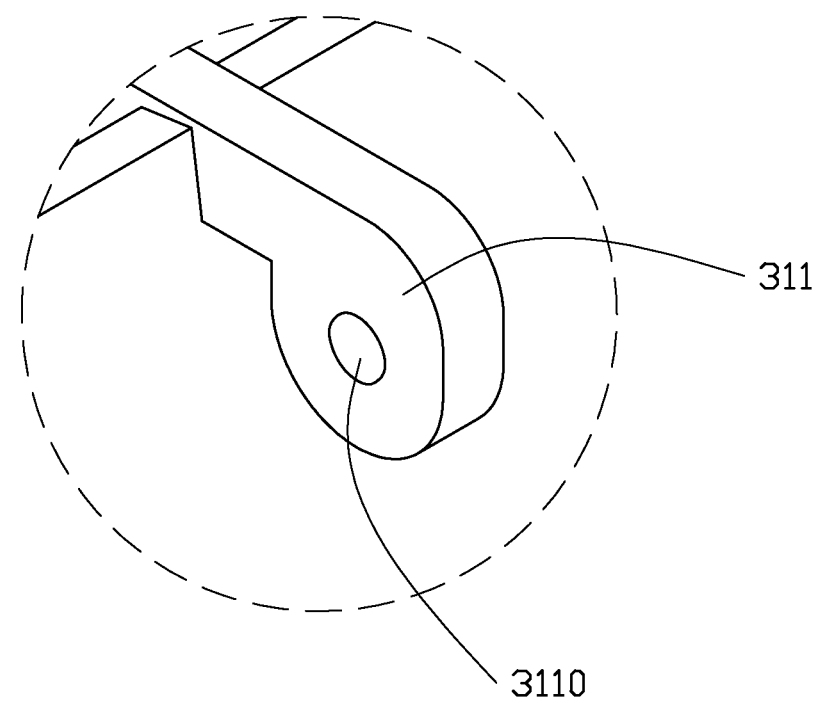
FIG. 3 is a partial enlarged, isometric view of the electronic device enclosure of FIG. 1, showing section III.

Referring to FIGS. 1 and 2, an electronic device enclosure includes an enclosure 10, a bracket 20 for holding storage devices (not shown), an air deflecting plate 30, an air guiding bracket 50 for guiding air and a fan receiving bracket 60 for fixing fans (not shown). The air deflecting plate 30 is fixed to the bracket 20. The bracket 20, the air guiding bracket 50 and the fan receiving bracket 60 are fixed to the enclosure 10.

The enclosure 10 includes a base panel 11, two substantially parallel side panels 13 and 14 that are substantially perpendicular to the base panel 11, and a rear panel 15 substantially perpendicular and connected to the side panels 13 and 14. A separating plate 40 is fixed to the base panel 11. A number of air outlets 151 are defined on the rear panel 15.

The bracket 20 is capable of being fixed between the separating plate 40 and side panel 13. The bracket 20 includes a bottom panel 21, a top panel 23 substantially parallel to the bottom panel 21, a front panel 25 and a rear panel 27. The bottom panel 21, top panel 23, front panel 25 and rear panel 27 cooperatively define an opening 80 for the storage devices to pass through and be received in the bracket 20. The bottom panel 21 defines a number of separating panels 211 for fixing the storage devices therebetween. Each separating panel 211 defines a number of through holes (not labeled) for allowing air therethrough. A bottom panel 21 side edge defines two fixing slots 213. The top panel 23 is substantially perpendicular and connected to the front panel 25 and rear panel 27. A top panel 23 side edge defines two fixing members 231. Each fixing member 231 defines a position hole 2311. The front panel 25 defines a number of air inlets 251. The rear panel 27 defines an air outlet 271, which is in communication with the air guiding bracket 50.

Referring to FIGS. 3 to 7, an air deflecting plate 30 top edge defines two pivot members 311 that correspond the fixing members 231. An air deflecting plate 30 bottom edge defines two securing members 312 that correspond the fixing slots 213. The air deflecting plate 30 defines a number of air guiding panels 33. Each pivot member 311 defines a pivot hole 3110 that correspond the position holes 2311. Two fasteners 70 pass through the corresponding position holes 2311 and pivot holes 3110 to pivotally fix the air deflecting plate 30 onto the top panel 23. Each securing member 312 includes an upright portion 3121. An upright portion 3121 bottom edge extends horizontally to form a bottom wall 3122. A bottom wall 3122 side edge extends diagonally to form an elastic supporting arm 3123. A portion of the supporting arm 3123, which is substantially adjacent with a distal end of the supporting arm 3123, extends horizontally to form a blocking member 3124 that is substantially parallel to the bottom wall 3122. A distance between the upright portion 3121 and the blocking member 3124 is greater than a length of the fixing slot 213 in a direction perpendicular to the bottom panel 21, side edge. A thickness of the air deflecting plate 30 is greater than that of the upright portion 3121.

Each air guiding panel 33 is substantially blade shaped with a width that increases from top to bottom. The air guiding panel 33 is located between the number of separating panels 211, to divide the bracket 20 into several separate areas and improve heat dissipation efficiency. In one embodiment, the air deflecting plate 30 defines three air guiding panels 33 to divide the bracket 20 into four areas.

The air guiding bracket 50 and fan receiving bracket 60 are fixed to the base panel 11. The air guiding bracket 50 is located on a back side of the bracket 20. The bracket 60 is located on a back side of the air guiding bracket 50 and abuts the rear panel 15. The air guiding bracket 50 and fan receiving bracket 60 are in communication with the number of air outlets 151 on the rear panel 15.

Figure 4:
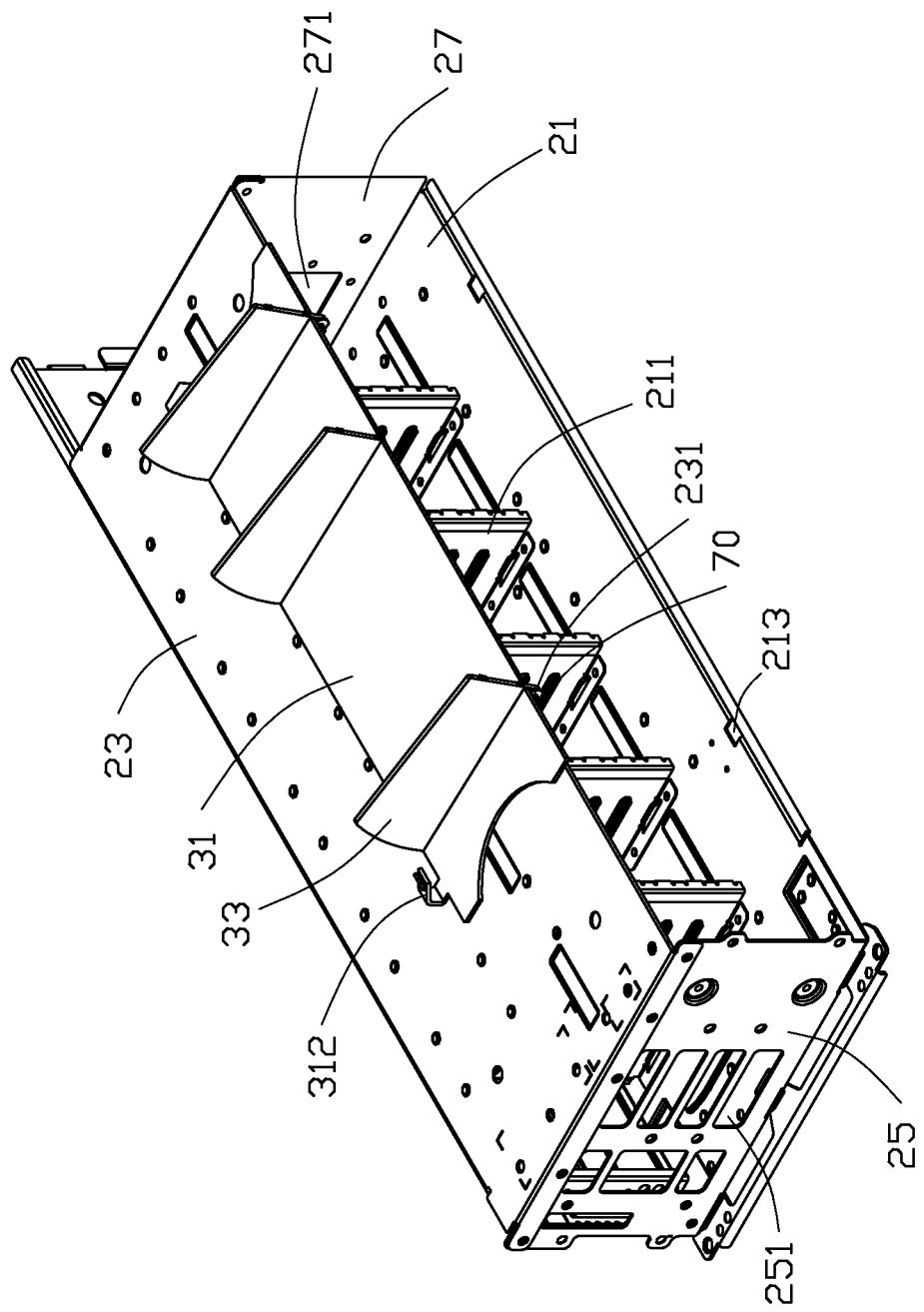
FIG. 4 is an assembled view of a first state of the bracket and the air deflecting plate of FIG. 1.
Figure 5:
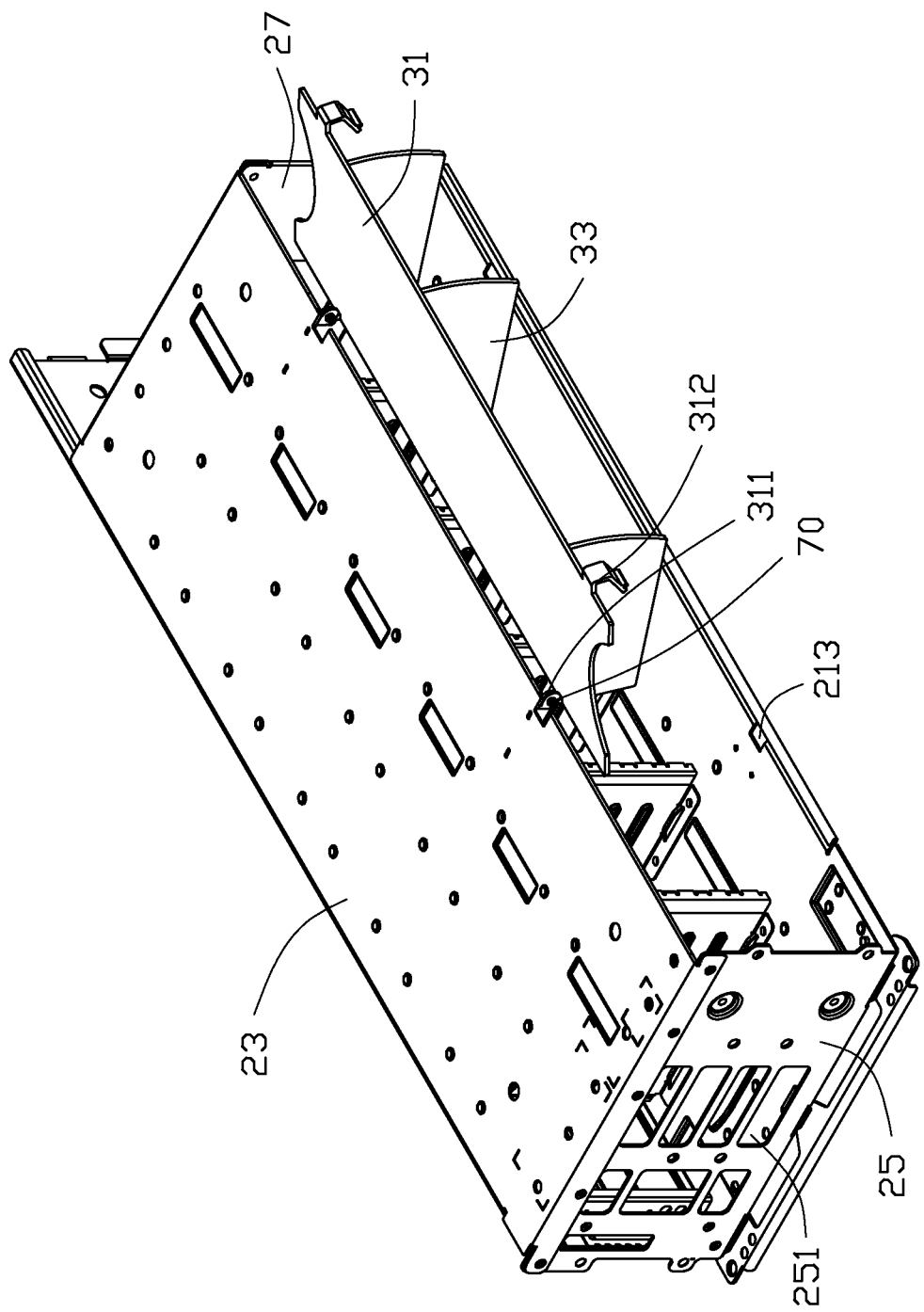
FIG. 5 is an assembled view of a second state of the bracket and the air deflecting plate of FIG. 4.

Referring to FIGS. 4 and 5, in assembly, the air deflecting plate 30 is put on one side of the bottom panel 21 and top panel 23. The pivot members 311 abut the corresponding fixing members 231 to align the pivot holes 3110 and the corresponding position holes 2311. Two fasteners 70 pass through the pivot holes 3110 and position holes 2311 to fix the air deflecting plate 30 top edge on the bracket 20. The air deflecting plate 30 is capable of rotating around the fasteners 70.

Figure 6:
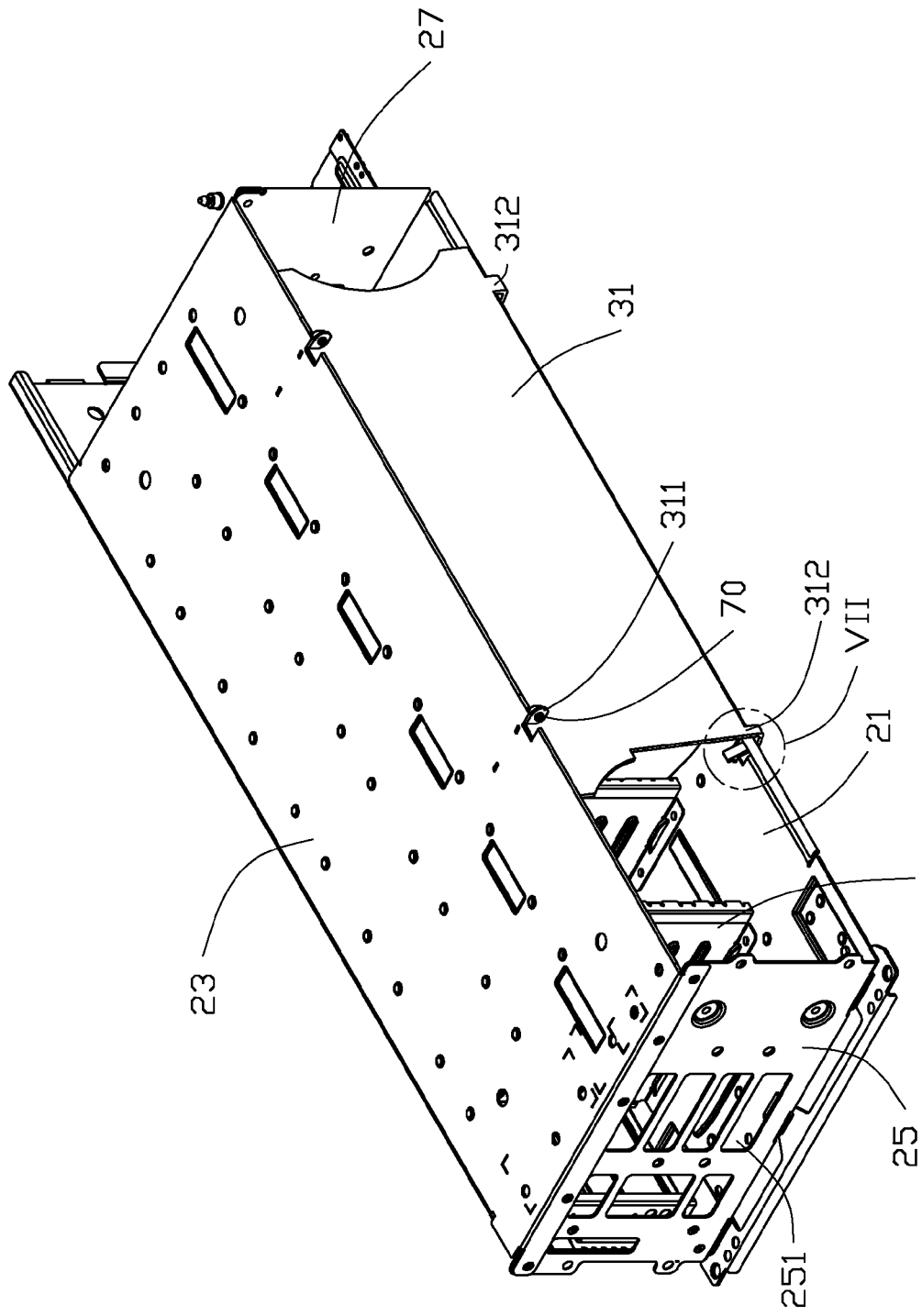
FIG. 6 is an assembled view of a third state of the bracket and the air deflecting plate of FIG. 4.
Figure 7:
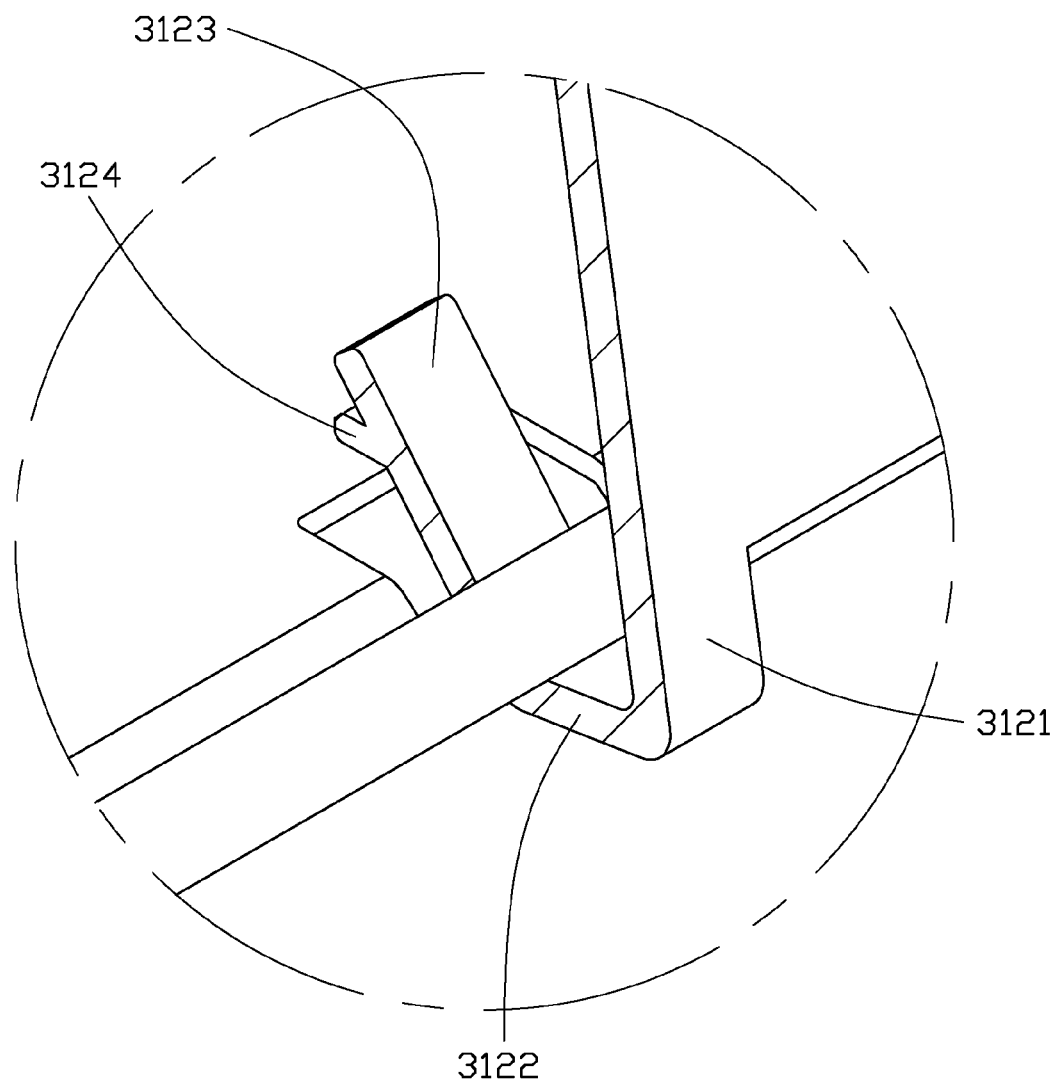
FIG. 7 is a partial enlarged, isometric view of the electronic device enclosure of FIG. 6, showing section VII.

Referring to FIGS. 5 and 6, the air deflecting plate 30 is rotated around the fasteners 70. The supporting arm 3123 inserts in the fixing slot 213, the fixing slot 213 abuts the supporting arm 3123 and the supporting arm 3123 is elastically distorted. Rotating the air deflecting plate 30 until the bottom panel 21 side edge abuts the upright portion 3121. An air deflecting plate 30 bottom edge abuts the bottom panel 21 side edge. The supporting arm 3123 is elastically returned a little, and the blocking member 3124 abuts a fixing slot 213 side edge to fix the securing member 312 in the fixing slot 213.

Figure 8:
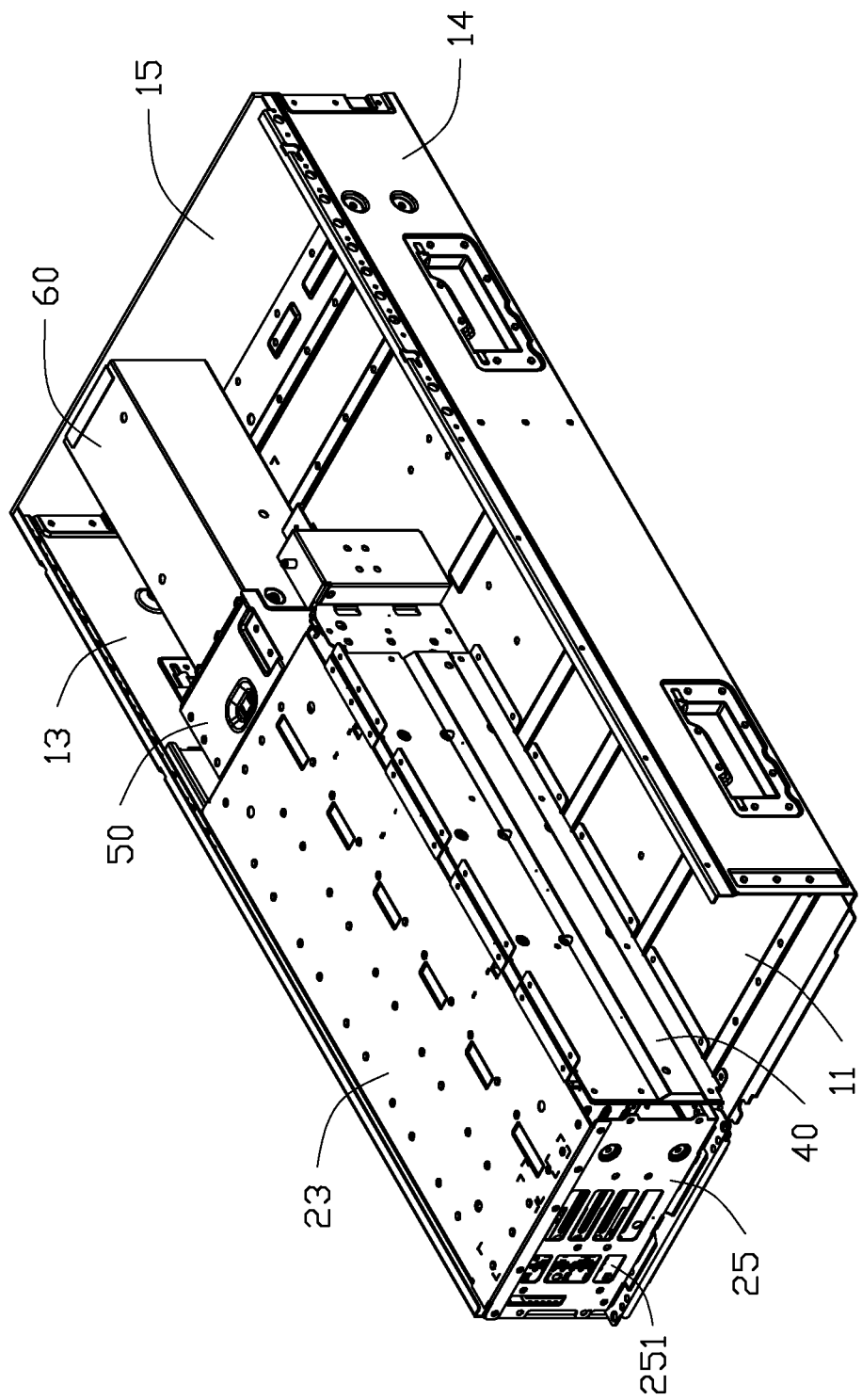
FIG. 8 is an assembled view of FIG. 1.
Figure 9:
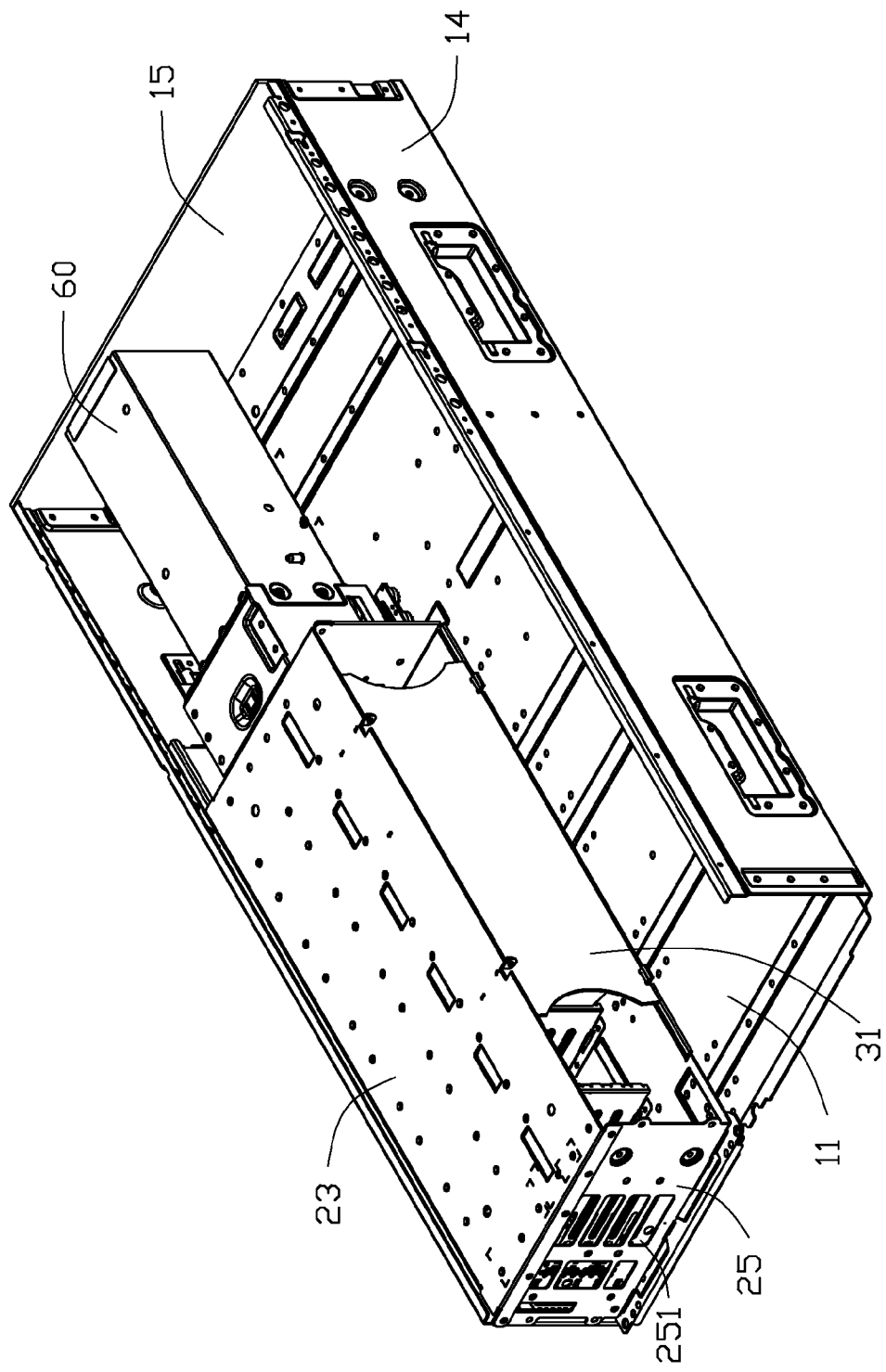
FIG. 9 is an assembled view of FIG. 1 without the separating plate.

Referring to FIGS. 8 and 9, the assembled bracket 20 and air deflecting plate 30 are fixed onto the base panel 11 between the side panels 13 and separating plate 40. The front panel 25 is adjacent to a base panel 11 front edge. The air guiding bracket 50 is fixed at the back of the bracket 20. The fan receiving bracket 60 is fixed between the air guiding bracket 50 and rear panel 15. In use, the cool air outside the bracket 20 is sucked into the bracket 20 by the number of air inlets 251 by the fans fixed to the fan receiving bracket 60. Most of the cool air is deflected by the air deflecting plate 30 and cannot leak out from the opening 80. The cool air displaces the warm air heated by the storage devices held on the bracket 20. The warm air is blown out of the bracket 20 through the air outlet 271 and blown into the air guiding bracket 50 by the fans fixed to the fan receiving bracket 60. The warm air passing through the fan receiving bracket 60 can be propelled out of the enclosure 10 through the number of air outlets 151. Therefore, a heat dissipation efficiency of the storage devices is improved.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device enclosure, comprising:
   an enclosure;
   a bracket, fixed to the enclosure, having an opening large enough to allow storage devices to pass therethrough; and
   an air deflecting plate fixed to the bracket, and the air deflecting plate comprises:
     two pivot members, defined on an air deflecting plate top edge, fixed to a top of the bracket; and
     two securing members, defined on an air deflecting plate bottom edge, elastically fixed to a bottom of the bracket; wherein the air deflecting plate is fixed to the bracket and covers the opening, which is capable of deflecting air from outside of the bracket; wherein the bracket comprises a top panel and a bottom panel; a top panel side edge defines two fixing members that correspond to the pivot members; each pivot member defines a pivot hole thereon; each fixing member defines a position hole that corresponds to the pivot holes; fasteners are capable of passing through the pivot holes and the corresponding position holes to fix the air deflecting plate top edge to the bracket; a bottom panel side edge defines two fixing slots that correspond to the securing members; each securing member comprises an upright portion; an upright portion bottom edge extends horizontally to form a bottom wall; a bottom wall side edge extends diagonally to form an elastic supporting arm; the distal end of the elastic supporting arm extends horizontally to form a blocking member that is substantially parallel to the bottom wall; the supporting arm is inserted in the fixing slot, the supporting arm elastically abuts the fixing slot; and the blocking member abuts a side edge of the fixing slot to fix the securing members in the fixing slots.

2. The electronic device enclosure of claim 1, wherein a distance between the upright portion and the blocking member is greater than a length of the two fixing slots in a direction perpendicular to the bottom panel side edge.

3. The electronic device enclosure of claim 2, wherein a thickness of the air deflecting plate is greater than that of the upright portion; the air deflecting plate bottom edge abuts the bottom panel side edge when the securing members are fixed in the two fixing slots.

4. The electronic device enclosure of claim 1, wherein the bracket further comprises a front panel defining a number of air inlets thereon, and a rear panel defining an air outlet thereon.

5. The electronic device enclosure of claim 1, wherein the bracket defines a number of separating panels thereon for fixing the storage devices therebetween; each separating panel defines a number of through holes thereon for outputting air; the air deflecting plate defines a number of air guiding panels thereon; and the air guiding panels are capable of being inserted between the number of separating panels to divide the bracket into several separate areas.

6. The electronic device enclosure of claim 4, wherein an air guiding bracket is fixed to the enclosure and is in communication with the rear panel air outlet; a fan receiving bracket for fixing fans is fixed to the enclosure; the air guiding bracket is on a back side of the bracket; and the bracket is on the back side of the air guiding bracket and abuts the rear panel.

7. An electronic device enclosure, comprising:
   a bracket having an opening large enough to allow storage devices to pass therethrough, wherein the bracket comprises a bottom panel that defines two fixing slots thereon, and a top panel, a side edge of the top panel comprising two fixing members thereon; each of the two fixing members forms a position hole thereon; and
   an air deflecting plate fixed to the bracket, and the air deflecting plate comprises:
     two pivot members, defined on an air deflecting plate top edge, are fixed to a top of the bracket; each of the two pivot members defines a pivot hole thereon; a top edge of the air deflecting plate being fixed to the bracket by each of a plurality of fasteners passing through each of the pivot holes and each of the position holes correspondingly located relative to the pivot holes; and
     two securing members, defined on an air deflecting plate bottom edge and correspondingly located relative to the two fixing slots, are elastically fixed to the bottom panel; and each securing member comprises:
       an upright portion;
       a bottom wall extends horizontally from an upright portion bottom edge;
       an elastic supporting arm extends diagonally from a bottom wall side edge;
       a blocking member that is substantially parallel to the bottom wall and extends horizontally from a distal end of the elastic supporting arm;
       wherein the air deflecting plate is fixed to the bracket to cover the opening and is capable of deflecting air from outside of the bracket; the air deflecting plate is rotated around the fasteners;
     the supporting arm is inserted into the fixing slot, the fixing slot abuts the supporting arm and the supporting arm is elastically distorted; the air deflecting plate is rotated until a side edge of the bottom panel abuts the upright portion; the supporting arm is elastically returned; and the blocking member abuts a side edge of the fixing slot to fix the securing members in the fixing slots.

8. The electronic device enclosure of claim 7, wherein a distance between the upright portion and the blocking member is greater than a length of the two fixing slots in a direction perpendicular to the bottom panel side edge.

9. The electronic device enclosure of claim 8, wherein a thickness of the air deflecting plate is greater than that of the upright portion; the air deflecting plate bottom edge abuts the bottom panel side edge when the securing members are fixed in the two fixing slots.

10. The electronic device enclosure of claim 7, wherein the bracket further comprises a front panel defining a number of air inlets thereon, and a rear panel defining an air outlet thereon.

11. The electronic device enclosure of claim 7, wherein the bracket defines a number of separating panels thereon for fixing the storage devices therebetween; each separating panel defines a number of through holes thereon for outputting air; the air deflecting plate defines a number of air guiding panels thereon; and the air guiding panels are capable of being inserted between the number of separating panels to divide the bracket into several separate areas.

12. The electronic device enclosure of claim 10, wherein an air guiding bracket is fixed to the enclosure and is in communication with the rear panel air outlet; a fan receiving bracket for fixing fans is fixed to the enclosure; the air guiding bracket is on a back side of the bracket; and the bracket is on the back side of the air guiding bracket and abuts the rear panel.

\* \* \* \* \*